United States Patent
Hsueh

(10) Patent No.: US 8,816,232 B2
(45) Date of Patent: Aug. 26, 2014

(54) TOUCH PANEL

(71) Applicant: Fu-Yuan Hsueh, Taoyuan County (TW)

(72) Inventor: Fu-Yuan Hsueh, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 48 days.

(21) Appl. No.: 13/622,365

(22) Filed: Sep. 19, 2012

(65) Prior Publication Data

US 2014/0076706 A1    Mar. 20, 2014

(51) Int. Cl.
- *H03K 17/975* (2006.01)
- *H03K 17/96* (2006.01)
- *G06F 3/044* (2006.01)

(52) U.S. Cl.
CPC .... *H03K 17/9622* (2013.01); *H03K 2017/9602* (2013.01); *G06F 3/044* (2013.01)
USPC .................................................. 200/600

(58) Field of Classification Search
CPC .................. H01H 2207/004; H01H 2207/01; H01H 2207/016; H01H 2207/04; H01H 2209/00; H01H 2209/024; H01H 2209/038; H01H 2209/074; H01H 2211/024; H01H 2221/002
USPC ................... 200/600, 46, 5 R, 5 A, 292, 243
See application file for complete search history.

(56) References Cited

U.S. PATENT DOCUMENTS

| | | | |
|---|---|---|---|
| 7,920,129 B2 * | 4/2011 | Hotelling et al. | 345/173 |
| 8,026,903 B2 * | 9/2011 | Hamblin et al. | 345/173 |
| 2009/0091551 A1 | 4/2009 | Hotelling et al. | |

FOREIGN PATENT DOCUMENTS

| | | |
|---|---|---|
| TW | 200837621 | 9/2008 |
| TW | 200846997 | 12/2008 |
| TW | 200912719 | 3/2009 |
| TW | 200915163 | 4/2009 |
| TW | 201005597 | 2/2010 |
| TW | 201111808 | 4/2011 |
| TW | M419991 | 1/2012 |

OTHER PUBLICATIONS

"Office Action of Taiwan Counterpart Application", issued on Jun. 18, 2014, p. 1-p. 9.

* cited by examiner

*Primary Examiner* — Edwin A. Leon
*Assistant Examiner* — Anthony R. Jimenez
(74) *Attorney, Agent, or Firm* — Jianq Chyun IP Office

(57) ABSTRACT

A touch panel includes a substrate having a first surface and a bonding region, first electrode lines, sets of electrode pads, first connecting lines, second connecting lines, and a flexible printed circuit having bridge lines and bonded to the bonding region. The first electrode lines are arranged abreast on the first surface along a first direction and respectively extend along a second direction intersecting the second direction. Each electrode pads set is arranged aside the corresponding first electrode line along the second direction. The first connecting lines are respectively connected to the first electrode lines, and the second connecting lines are respectively connected to the electrode pads, and both the first and second connecting lines extend to the bonding region along the second direction. The bridge lines are respectively connected to the second connecting lines, so that the corresponding electrode pads in the first direction form a second electrode line.

10 Claims, 4 Drawing Sheets

TOUCH PANEL

BACKGROUND

1. Field of the Application

The application is related to a touch panel, and more particularly, to a capacitive touch panel.

2. Description of Related Art

In recent years, as information technology, wireless mobile communication and information appliances have been rapidly developed and applied, to achieve more convenience, more compact and light volume and more user-friendly designs, various information products have changed from using conventional input devices such as keyboards or mice to using touch panels.

Based on different sensing types, touch panels can be generally categorized into resistive touch panels, capacitive touch panels, optical touch panels, acoustic-wave touch panels, and electromagnetic touch panels. Compared with other types of touch panels, the capacitive touch panel is characterized by quick response speed, favorable reliability, high definition, and so on. Therefore, the capacitive touch panel is widely used in various handheld electronic devices.

The capacitive touch panel uses a plurality of alternately arranged stripe electrodes to form a sensing array so as to achieve surface sensing. When a user touches the touch panel with a finger, the touch panel determines a position where the finger touches according to a variation in capacitance on the sensing array.

It is known that peripheral circuits of the touch panel or connection circuits of an electrode pad occupy a wring space on a substrate. When the sensing resolution increases, complicated wiring occupies larger border or poses limitation on the disposition of the electrode pads. Thus, it is disadvantageous for the structure and electrical design of the touch panel.

SUMMARY

The application provides a touch panel which effectively uses a wiring space on a substrate to improve the tolerance of structure and electrical design.

The application provides a touch panel including a substrate, a plurality of first electrode lines, plurality sets of electrode pads, a plurality of first connecting lines, a plurality of second connecting lines and a flexible printed circuit. The substrate has a first surface, and a peripheral of the first surface has a bonding region. The first electrode lines are arranged abreast on the first surface along a first direction, and each of the first electrode lines extends along a second direction, wherein the first direction intersects the second direction. The electrode pads sets are on the first surface and are disposed corresponding to the first electrode lines, respectively, wherein each set of the electrode pads is arranged aside the corresponding first electrode lines along the second direction. The first connecting lines are respectively connected to the first electrode lines and extend to the bonding region along the second direction. The second connecting lines are respectively connected to the electrode pads and extend to the bonding region along the second direction. The flexible printed circuit is bonded to the bonding region, wherein the flexible printed circuit includes a plurality of bridge lines respectively connected to the second connecting lines, and each of the bridge lines forms a second electrode line by the corresponding second connecting lines electrically connected to the corresponding electrode pads in the first direction.

Based on the above, the touch panel of the application uses the bridge lines of the flexible printed circuit to connect the corresponding second connecting lines, which simplifies the manufacturing process of the touch panel, improves the production yield and decreases the border size of the touch panel.

In order to make the aforementioned features and advantages of the application more comprehensible, embodiments accompanying figures are described in details below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the application.

DESCRIPTION OF EMBODIMENTS

Figure 1:
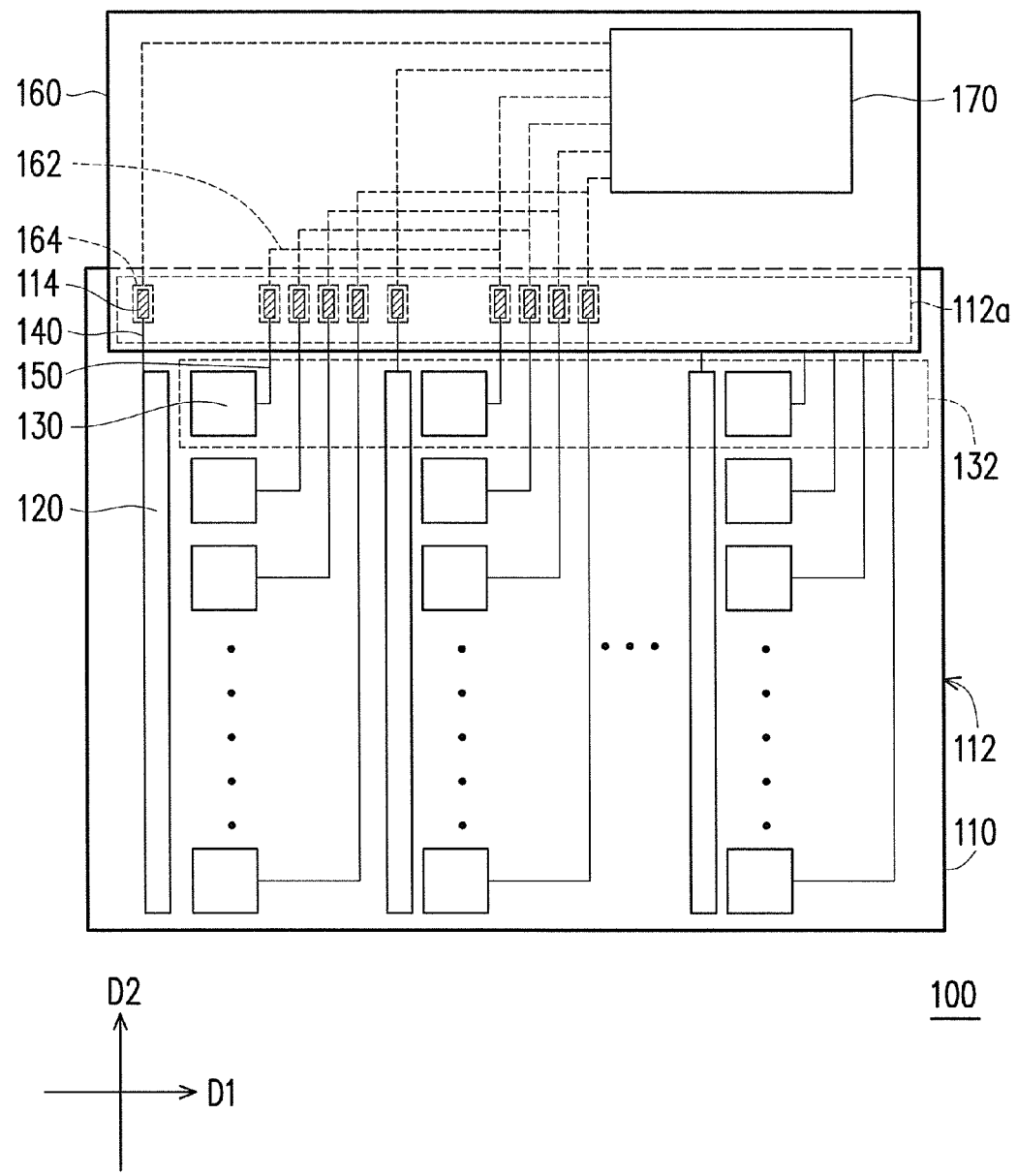
FIG. 1 is a schematic view of a touch panel according to an embodiment of the invention.

FIG. 1 is a schematic view of a touch panel according to an embodiment of the invention. Referring to FIG. 1, a touch panel 100 includes a substrate 110, a plurality of first electrode lines 120, plurality sets of electrode pads 130, a plurality of first connecting lines 140, a plurality of second connecting lines 150 and a flexible printed circuit 160. The substrate 110 has a first surface 112, and a peripheral of the first surface 112 has a bonding region 112*a*. The first electrode lines 120 are arranged abreast on the first surface 112 along a first direction D1, and each of the first electrode lines 120 extends along a second direction D2, wherein the first direction D1 intersects the second direction D2.

The sets of electrode pads 130 are on the first surface 112 and are disposed corresponding to the first electrode lines 120, respectively, wherein each set of the electrode pads 130 is arranged aside the corresponding first electrode lines 120 along the second direction D2. The first connecting lines 140 are respectively connected to the first electrode lines 120 and extend to the bonding region 112*a* along the second direction D2. The second connecting lines 150 are respectively connected to the electrode pads 130 and extend to the bonding region 112*a* along the second direction D2. The flexible printed circuit 160 is bonded to the bonding region 112*a* by, for example, adhering. The flexible printed circuit 160 includes a plurality of bridge lines 162 respectively connected to the second connecting lines 150, and each of the bridge lines 162 is electrically connected to the corresponding electrode pads 130 in the first direction D1 by the corresponding second connecting lines 150 to form a second electrode line 132.

In the present embodiment, each of the second connecting lines 150 serially connects each of the electrode pads 130 through the bridge lines 162 on the flexible printed circuit 160 to form a second electrode line 132. In this way, no additional bridging process has to be performed on the substrate 110. Therefore, the manufacturing process of the touch panel 100 is simplified, the production yield is improved, and costs are saved. In addition, manufacturing the bridge lines 162 on the flexible printed circuit 160 further has the advantage of reducing the border size of the touch panel 100 because the pitch between two lines manufactured on the flexible printed circuit 160 is smaller than the pitch of those manufactured directly on the substrate 110.

In addition, in the present embodiment, each of the first electrode lines 120 extends along the second direction D2, and each of the second electrode lines 132 extends along the first direction D1. Therefore, the first electrode lines 120 and the second electrode lines 132 are substantially crossly disposed on the first surface 112 of the substrate 110 to form an array arrangement of multiple columns and multiple rows. The touch panel 100 achieves surface sensing by the cross disposition of the first electrode lines 120 and the second electrode lines 132. When a user touches the touch panel 100 with a finger, a variation in capacitance between the first electrode lines 120 and the second electrode lines 132 at a position where the finger touches is induced. Coordinates of the touch point based on the variation in capacitance is calculated and transmitted to an electronic device connected to the touch panel 100. In the present embodiment, the first electrode lines 120 are driving lines, and the second electrode lines 132 are sensing lines. Two different kinds of electrode lines are used to achieve the required sensing functions.

In addition, each of the second connecting lines 150 are connected on the same side of each of the electrode pads 130 and disposed between a first electrode line 120 and the electrode pad 130 connected to the second connecting lines 150. In other words, the border size of the touch panel 100 can be reduced by disposing the second connecting lines 150 on a space between each of the first electrode lines 120 and the electrode pads 130. In the present embodiment, a material of each of the second connecting lines 150 includes transparent conductive materials, such as indium tin oxide (ITO), indium zinc oxide (IZO), aluminum doped zinc oxide (AZO) or indium oxide or any combination thereof.

In the present embodiment, the first electrode lines 120 and the electrode pads 130 are all located on the first surface 112, thereby reducing a thickness of the touch panel 100 and increasing transmittance. Therefore, when the touch panel 100 is integrated with a display panel as a display having a touch-control function, the touch panel 100 provides a good display effect.

As shown in FIG. 1, in detail, the touch panel 100 includes a plurality of contacts 114 disposed in the bonding region 112a. The contacts 114 respectively connect each of the first connecting lines 140 and each of the second connecting lines 150 and are bonded to a plurality of pins 164 on the flexible printed circuit 160 correspondingly. Furthermore, the touch panel 100 further includes a control chip 170 disposed on the flexible printed circuit 160 and electrically connected to the flexible printed circuit 160. The control chip 170 is electrically connected to the first connecting lines 140 and the second connecting lines 150 via the flexible printed circuit 160, for transmitting or receiving input/output signals in the first electrode lines 120 and the electrode pads 130. In the present embodiment, the control chip 170 is disposed on the flexible printed circuit 160. In other words, the control chip 170 of the present embodiment is exemplified with a chip-on-film (COF) package structure. However, the connection methods of the control ship 170 and the first connecting lines 140 and the second connecting lines 150 are not limited to the above.

Figure 2:
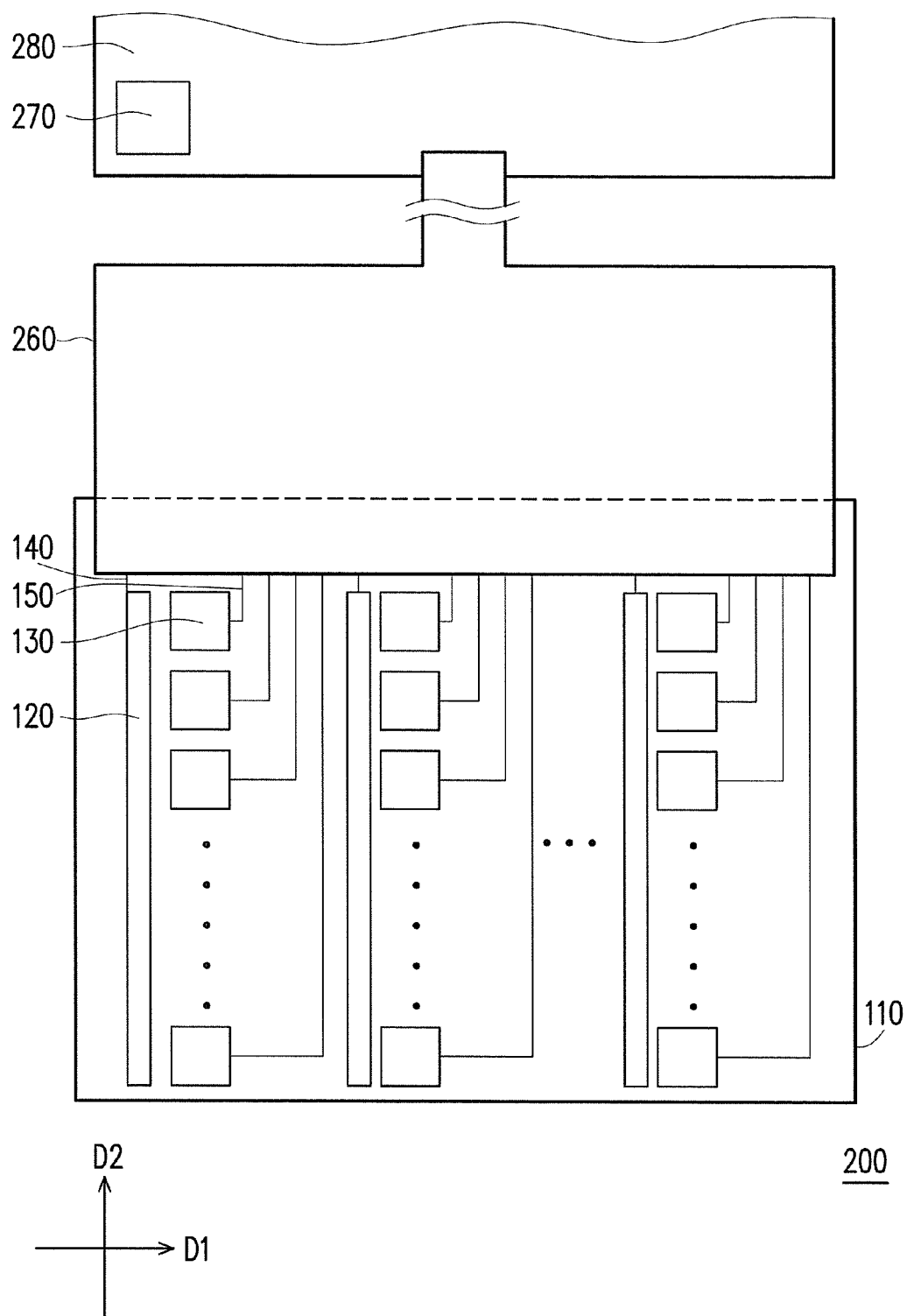
FIG. 2 is a schematic view of a touch panel according to another embodiment of the invention.

FIG. 2 is a schematic view of a touch panel according to another embodiment of the invention. It should be noted that the reference numerals and a part of the contents in FIG. 1 are used in FIG. 2, in which identical reference numerals indicate identical or similar components, and repeated description of the same technical contents is omitted. For a detailed description of the omitted parts, reference can be found in the previous embodiment, and no repeated description is contained in the following embodiments.

Referring to FIG. 2, the difference between the present embodiment and the embodiment of FIG. 1 mainly lies in a package method of a control chip 270. In the present embodiment, a touch panel 200 includes a printed circuit board 280 and a control chip 270. The printed circuit board 280 is electrically connected to the flexible printed circuit 260, and the control chip 270 is disposed on the printed circuit board 280 and electrically connected to the first connecting lines 140 and the second connecting lines 150 through the printed circuit board 280 and a flexible printed circuit 260. The control chip 270 transmits the input signals and the output signals in the first electrode lines 120 and the electrode pads 130 through the first connecting lines 140 and the second connecting lines 150. The control chip 270 of the present embodiment disposed on the printed circuit board 280 can be provided as a chip-on-board (COB) package structure, for example. In addition, the flexible printed circuit 260 may be provided with a connector, through which the flexible printed circuit 260 is connected to the printed circuit board 280.

Figure 3:
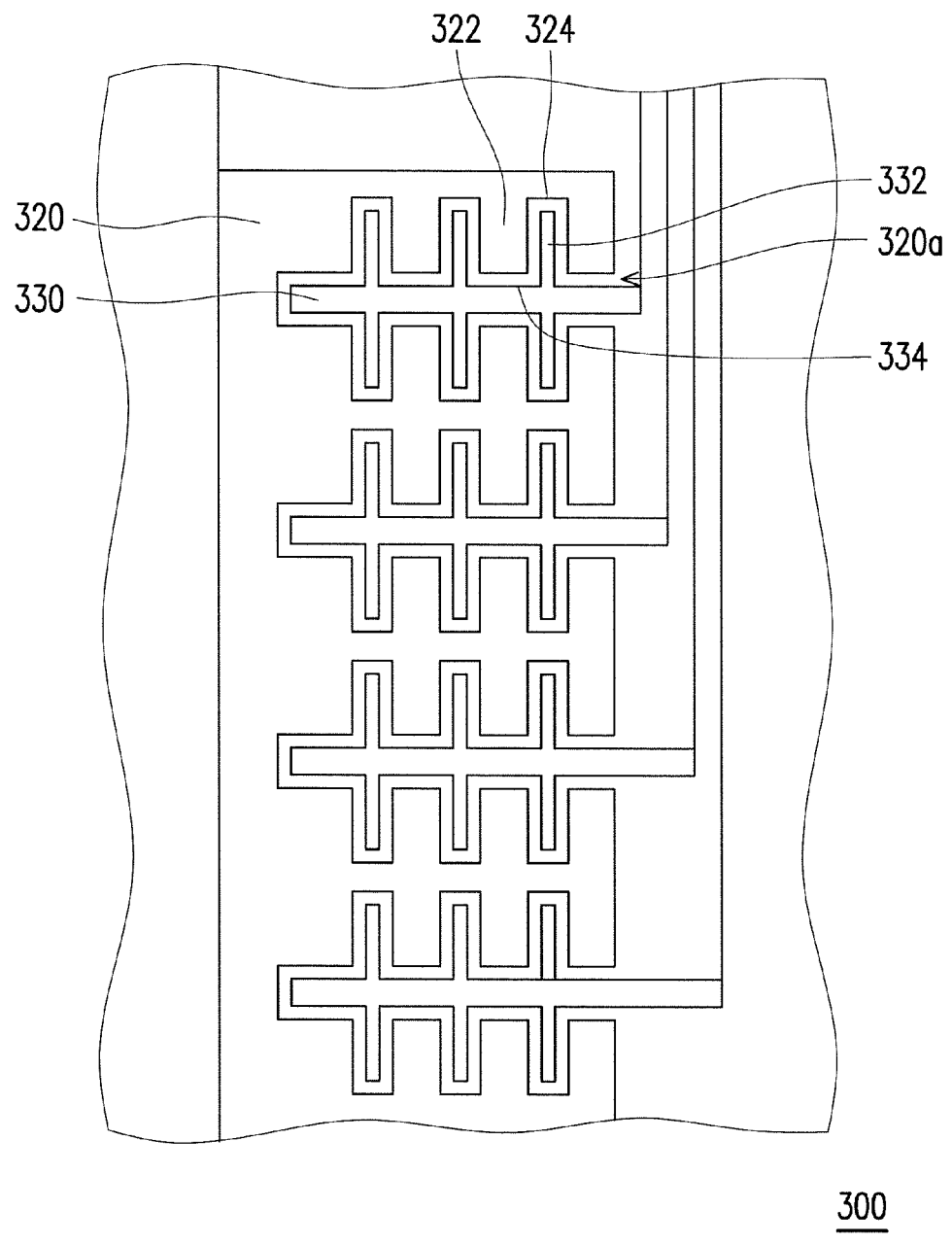
FIG. 3 is a schematic view of first electrode lines and electrode pads according to another embodiment of the invention.

FIG. 3 is a schematic view of first electrode lines and electrode pads according to another embodiment of the invention. A touch panel generates a variation in capacitance at the position where the finger touches, then calculates the coordinate of the touch point based on the variation in capacitance and transmits the coordinate to an electronic device connected to the touch panel. Therefore, one of the key points in design is to increase a coupling capacitance between the first electrode lines and the electrode pads. In the present embodiment, first electrode lines 320 have a plurality of notches 320a corresponding to electrode pads 330, and at least a portion of each of the electrode pads 330 is located in the corresponding notch 320a. In the present embodiment, a profile of the electrode pads 330 is complementary with a profile of the corresponding notches 320a. For example, edges of the electrode pads 330 are convex in compliance with the concaved notches 320a. In the case that the profile of the electrode pads 330 is complementary with the profile of the corresponding notches 320a, the capacitance between each of the first electrode lines 320 and the corresponding electrode pads 330 is dramatically increased.

Based on the above, as shown in FIG. 3, the comb-shaped electrode pads 330 and the comb-shaped notches 320a are taken as an example in the present embodiment. Each of the combs is substantially formed by a plurality of concave portions and convex portions alternatively arranged. Convex portions 332 of the comb-shaped electrode pads 330 extend into concave portions 324 of the comb-shaped notches 320a, and convex portions 322 of the comb-shaped notches 320a extend into concave portions 334 of the comb-shaped electrode pads 330. In this way, the capacitance between each of the first electrode lines 320 and the corresponding electrode pad 330 can be increased, thereby enhancing the operation sensitivity of the touch panel 300.

Figure 4:
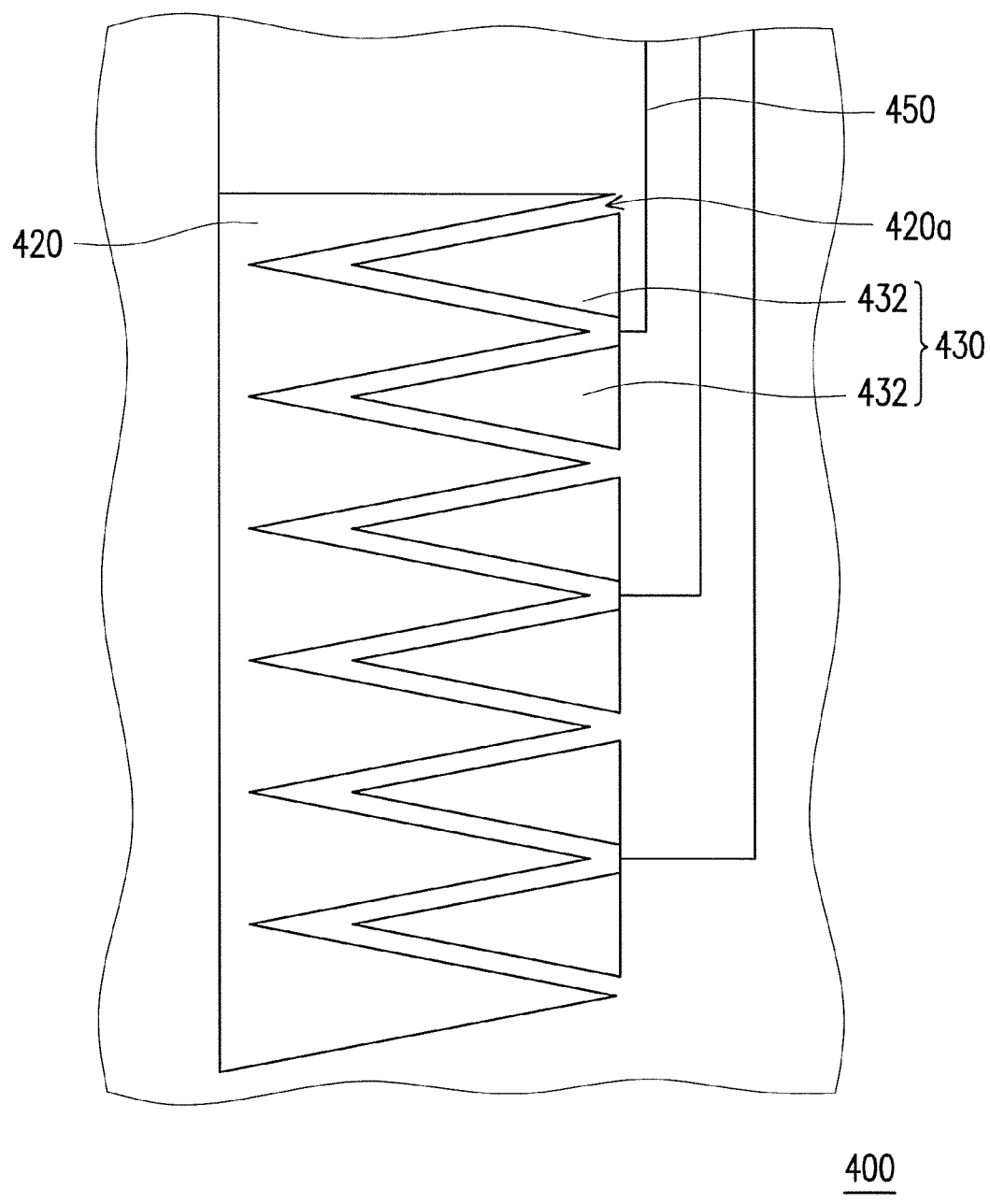
FIG. 4 is a schematic view of first electrode lines and electrode pads according to still another embodiment of the invention.

FIG. 4 is a schematic view of first electrode lines and electrode pads according to still another embodiment of the invention. The present embodiment is similar to the embodiment of FIG. 3, and the difference between the two mainly lies in shapes of notches 420a of first electrode lines 420 and shapes of their corresponding electrode pads 430. Referring to FIG. 4, in the present embodiment, the notch 420a of each of the first electrode lines 420 and the corresponding electrode pad 430 respectively form a jagged structure. Herein, the jagged structure formed by the notches 420a of the first electrode lines 420 faces the jagged structure formed by the corresponding electrode pads 430.

In addition, the jagged structure formed by the notches 420a of the first electrode lines 420 and the jagged structure formed by the electrode pads 430 are composed of a plurality of triangular patterns. In the present embodiment, each of the electrode pads 430 is composed of two triangular patterns 432, and the two triangular patterns 432 share one second connecting line 450. However, the application does not limit the number of the triangular patterns 432 that form a jagged structure. The triangular patterns 432 of each of the electrode pads 430 are located in a jagged notched 420a of their corresponding first electrode line 420. Similarly, the above way of pattern design increases the capacitance between each of the first electrode lines 420 and the corresponding electrode pad 430 and enhances the operation sensitivity of the touch panel 400.

In summary of the above, the touch panel of the application uses the bridge lines of the flexible printed circuit to connect the corresponding second connecting lines, which simplifies the manufacturing process of the touch panel, improves the production yield and decreases the border size of the touch panel. In addition, in the pattern design of the touch panel of the application, each of the electrode pads can be formed in compliance with the notch of each of the corresponding first electrode lines, which increases the coupling capacitance between the first electrode lines and the electrode pads and enhances the operation sensitivity of the touch panel.

Although the invention has been described with reference to the above embodiments, they are not intended to limit the invention. It is apparent to people of ordinary skill in the art that modifications and variations to the invention may be made without departing from the spirit and scope of the invention. In view of the foregoing, the protection scope of the invention will be defined by the appended claims.

What is claimed is:

1. A touch panel, comprising:
    a substrate having a first surface, wherein a peripheral of the first surface has a bonding region;
    a plurality of first electrode lines arranged abreast on the first surface along a first direction, wherein each of the first electrode lines extends along a second direction, and the first direction intersects the second direction;
    plurality sets of electrode pads disposed on the first surface and disposed corresponding to the first electrode lines, respectively, wherein each set of the electrode pads is arranged aside the corresponding first electrode line along the second direction;
    a plurality of first connecting lines respectively connected to the first electrode lines and extending to the bonding region along the second direction;
    a plurality of second connecting lines respectively connected to the electrode pads and extending to the bonding region along the second direction; and
    a flexible printed circuit bonded to the bonding region, wherein the flexible printed circuit comprises a plurality of bridge lines respectively connected to the second connecting lines, and each of the bridge lines forms a second electrode line by the corresponding second connecting lines electrically connected to the corresponding electrode pads in the first direction.

2. The touch panel according to claim 1, wherein each of the first electrode lines has a plurality of notches corresponding to the electrode pads, and at least a portion of each of the electrode pads is located in the corresponding notch.

3. The touch panel according to claim 2, wherein a contour of each of the electrode pads is complementary with a contour of the corresponding notch.

4. The touch panel according to claim 3, wherein each of the electrode pads and the corresponding notch are comb-shaped.

5. The touch panel according to claim 3, wherein the notches of each of the first electrode lines and the corresponding set of the electrode pads respectively foam a jagged structure.

6. The touch panel according to claim 1, wherein a material of the second connecting lines comprises a transparent conductive material.

7. The touch panel according to claim 1, comprising a plurality of contacts disposed in the bonding region, wherein the contacts respectively connect the first connecting lines and the second connecting lines and are bonded to a plurality of pins on the flexible printed circuit correspondingly.

8. The touch panel according to claim 1, further comprising a control chip disposed on the flexible printed circuit and electrically connected to the first connecting lines and the second connecting lines through the flexible printed circuit.

9. The touch panel according to claim 1, further comprising:
    a printed circuit board electrically connected to the flexible printed circuit; and
    a control chip disposed on the printed circuit board and electrically connected to the first connecting lines and the second connecting lines through the printed circuit board and the flexible printed circuit.

10. The touch panel according to claim 1, wherein the first electrode lines are driving lines, and the second electrode lines are sensing lines.

* * * * *